US009282851B2

(12) United States Patent
Cochran et al.

(10) Patent No.: US 9,282,851 B2
(45) Date of Patent: Mar. 15, 2016

(54) DIGITAL HEAT INJECTION BY WAY OF SURFACE EMITTING SEMI-CONDUCTOR DEVICES

(75) Inventors: Don W. Cochran, Gates Mills, OH (US); Benjamin D. Johnson, Lyndhurst, OH (US); Jonathan M. Katz, Solon, OH (US); Mark W. Moore, Aurora, OH (US); Noel E. Morgan, Jr., North Olmsted, OH (US); Denwood F. Ross, III, Austinburg, OH (US)

(73) Assignee: Pressco IP LLC, Cleveland, OH (US)

( * ) Notice: Subject to any disclaimer, the term of this patent is extended or adjusted under 35 U.S.C. 154(b) by 1236 days.

(21) Appl. No.: 12/718,919

(22) Filed: Mar. 5, 2010

(65) Prior Publication Data

US 2011/0002675 A1   Jan. 6, 2011

Related U.S. Application Data

(60) Provisional application No. 61/224,765, filed on Jul. 10, 2009, provisional application No. 61/157,799, filed on Mar. 5, 2009.

(51) Int. Cl.
| | | |
|---|---|---|
| *F26B 3/30* | (2006.01) | |
| *F24B 7/00* | (2006.01) | |
| *A47J 37/00* | (2006.01) | |
| *H01S 5/42* | (2006.01) | |

(52) U.S. Cl.
CPC . *A47J 37/00* (2013.01); *H01S 5/423* (2013.01)

(58) Field of Classification Search
None
See application file for complete search history.

(56) References Cited

U.S. PATENT DOCUMENTS

| 5,238,531 A | 8/1993 | Macomber et al. |
|---|---|---|
| 5,241,556 A | 8/1993 | Macomber et al. |
| 5,345,466 A | 9/1994 | Macomber |
| 5,610,930 A | 3/1997 | Macomber et al. |
| 5,867,521 A | 2/1999 | Macomber |
| 6,154,479 A | 11/2000 | Yoshikawa et al. |
| 6,195,381 B1 | 2/2001 | Botez et al. |
| 6,219,365 B1 | 4/2001 | Mawst et al. |
| 6,476,345 B1 | 11/2002 | Sator |
| 6,543,693 B1 | 4/2003 | Stern et al. |
| 6,810,053 B1 | 10/2004 | Botez et al. |
| 6,845,116 B2 | 1/2005 | Mawst et al. |
| 7,061,958 B2 | 6/2006 | Krupke |

(Continued)

FOREIGN PATENT DOCUMENTS

| JP | 2002-026452 | 1/2002 |
|---|---|---|
| JP | 2002-109769 A | 4/2002 |

(Continued)

OTHER PUBLICATIONS

International Search Report for PCT/US2010/026447 dated May 19, 2010.

(Continued)

*Primary Examiner* — Thor Campbell
(74) *Attorney, Agent, or Firm* — Fay Sharpe LLP (57) ABSTRACT

A method and system are provided for digitally injecting heat into a wide range of products by way of incorporation of a special class of semi-conductor lasers, e.g. surface emitting devices. This technique relates to a more specific, economical, and advantageous way of practicing the art of directly injecting narrowband radiant energy that desirously matches the absorption specification of a particular material at a specified wavelength.

32 Claims, 8 Drawing Sheets

(56) References Cited

U.S. PATENT DOCUMENTS

| | | |
|---|---|---|
| 7,126,975 B2 | 10/2006 | Iwasaki et al. |
| 2002/0190659 A1 | 12/2002 | Cao |
| 2004/0066817 A1 | 4/2004 | Ungar |
| 2005/0175059 A1 | 8/2005 | Leclair et al. |
| 2005/0180482 A1 | 8/2005 | Osowski et al. |
| 2005/0238079 A1 | 10/2005 | Botez |
| 2007/0096352 A1 | 5/2007 | Cochran et al. |
| 2007/0248131 A1 | 10/2007 | Botez et al. |
| 2008/0043794 A1 | 2/2008 | Botez |
| 2008/0089375 A1 | 4/2008 | Kanskar et al. |
| 2008/0205476 A1 | 8/2008 | Kanskar et al. |
| 2008/0212635 A1 | 9/2008 | Kanskar et al. |
| 2011/0002677 A1 | 1/2011 | Cochran et al. |

FOREIGN PATENT DOCUMENTS

| | | |
|---|---|---|
| JP | 2002-147762 A | 5/2002 |
| JP | 2002-535159 A | 10/2002 |
| JP | 2008-124358 | 5/2008 |
| JP | 2008-521662 A | 6/2008 |
| WO | WO/2004/009318 A1 | 1/2004 |
| WO | WO 2006/060690 A2 | 6/2006 |
| WO | WO 2008/075280 A1 | 6/2008 |
| WO | WO/2008/154503 A2 | 12/2008 |

OTHER PUBLICATIONS

Li Shiming, Huang Weiling, et al., "Theory and Design of Laser devices," pp. 343-348, published by National Defense Industry Publication in Jan. 2005 (ISBN 7-118-03590-4).

DIGITAL HEAT INJECTION BY WAY OF SURFACE EMITTING SEMI-CONDUCTOR DEVICES

This application is based on and claims priority to U.S. Provisional Application No. 61/224,765, filed Jul. 10, 2009, and U.S. Provisional Application No. 61/157,799, filed Mar. 5, 2009, both of which are incorporated herein by reference in their entirety.

INCORPORATION BY REFERENCE

U.S. Pat. No. 7,425,296; U.S. Ser. No. 11/448,630, filed Jun. 7, 2006; U.S. Ser. No. 12/135,739, filed Jun. 9, 2008 and U.S. Provisional Patent Application No. 61/157,799, filed Mar. 5, 2009, are hereby incorporated by reference in their entirety into the present disclosure.

FIELD OF INVENTION

This invention generally relates to a novel method of digitally injecting heat into a wide range of products by way of a novel incorporation of a special class of semi-conductor lasers, in one form, surface emitting devices. This invention relates to a more specific and advantageous way of practicing the art of directly injecting narrowband radiant energy that desirously matches the absorption specification of a particular material at a specified wavelength.

BACKGROUND OF THE INVENTION

The general techniques for practicing the art are thoroughly described in U.S. Pat. No. 7,425,296 (identified above) and the related patent family. The above family of patents generally teaches a technology which is known as narrowband digital heat injection by absorption spectrum matching, or for short, Digital Heat Injection, or DHI. An important DHI concept that must be well understood is that of matching the wavelength of irradiation to a particular wavelength at which the target has an absorption coefficient that is the most desirable for the desired application result. Since each type of material has its own unique absorption spectrum caused by the atomic absorption characteristics of its molecular makeup, it is necessary to understand what the absorption spectrum curve looks like for any given target material which is to be treated by way of DHI. The locus of points representing the complete set of absorption coefficients for each wavelength of irradiation will comprise the complete absorption curve for that material. The complete spectral absorption curve is often also referred to as the spectral curve or by other shortcut names. As a practitioner reduces DHI technology, to actually practice for a given application, there is a wide range of things to consider, as it is much more completely described in the '296 patent family referenced above.

While the term narrowband appropriately applies to all DHI applications, some applications are much more critical than others. For example, in some applications, two or three hundred nano-meters of bandwidth may be narrow enough to match a particular area of a given product's absorption curve. While each and every different material or compound has its own characteristic absorption curve shapes, they are often slow changing shapes in part of the curve and sharp or abruptly changing shapes in other portions of the curve.

Since every different type of material has its own characteristic curve shapes it is difficult to generalize, but while some materials will have gently changing absorption curves, many other materials will have areas of their absorption curve some place between UV and long infra-red which have rapidly or abruptly changing shapes. These will be areas of the absorption curve which have a very steep slope such that a small change in the wavelength equates to a very large change in the absorption coefficient. For example, pizza dough, water, pepperoni, and cheese all have active and rapidly changing curves in the 900-1500 nano-mater range wherein there are points at which less than a 50 nano-meter change in wavelength will yield a 3× to 5× difference in absorption coefficient. There are other materials, such as polyethylterylphthalate (or PET) material from which beverage and food containers are blown, which have portions of their absorption curves which are extremely steep. Targeting the exact point on such a steep curve in order to take advantage of the exact absorption coefficient which is optimal for heating the material in a desired way, requires a laser device that can be manufactured economically to a very high level of wavelength precision that is very repeatable. Similarly, if one is trying to hit a narrow peak or dip in the absorption curve (typically plotted using absorption on the y-axis and wavelength on the x-axis), wavelength precision is also required. The penalty for wavelength variation away from the desired center wavelength in such a case means that the irradiation would miss the peak and actually hit the target with energy that will be at a substantially different absorption than planned. The result would require a large change in the amount of energy required to achieve the desired heating or energy deposition.

Another concept of digital heat injection involves choosing wavelengths for a desired result when multiple different material types are involved. For example, choosing materials which have at least one wavelength at which the two materials have desireously different absorptions. When one material is highly transmissive at a wavelength at which the other is highly absorptive, it is possible to shoot the energy through a first transmissive material with minimal heating while achieving substantial absorption in the second material with a desired level of heating. This concept can be extended for more than two materials but the level of wavelength precision can rise even further. Additives can also be used which induce a high absorption peak to enhance the useability of this concept but it may further require high levels of wavelength choice and precision to accomplish the desired systemic result.

An important and often critically fundamental concept behind DHI technology involves choosing the right wavelength to have the precisely desired amount of absorption in a target. As has already been taught in the '296 patent family indicated above, the practitioner of digital heat injection will often want to choose two, three, or more wavelengths because each of them has a desirable absorption co-efficient at its respective wavelength. By irradiating with chosen proportioning, this allows a skillful practitioner to specify the exact combination of penetration and absorption that might be ideal for a given application. While DHI technology may work with reduced wavelength precision, it has been found that a substantial improvement can be made in the practice of the technology by incorporating a much higher level of wavelength precision. It has also been discovered that, certain specialized types of semi-conductor hardware may be necessary to further optimize the implementation and hit the precisely desired wavelengths with extremely narrowband energy and to accomplish it economically. Since lasers and other narrowband irradiation sources used for many DHI applications must be of a type and design that they can be manufactured and implemented economically in order to achieve broad commercialization, it is important to choose such lasers, LEDs or other narrowband emitting devices and manufacturing processes carefully.

Although nearly any type of laser or narrowband irradiator can be used to practice digital heat injection technology if it can be manufactured at the correct output wavelength for an application, there are certain practicalities which dictate a preference for certain types of irradiators for the desired application. In general, semi-conductor lasers which are also known as diode lasers, tend to be more practical because they lend themselves to the lower cost high production manufacturing. They also offer the ability to manufacture them at a much wider range of specific wavelengths, greater compactness, survivability, electrical efficiency, ruggedness, and other virtues.

Typical diode or semi-conductor lasers however, have certain limitations and manufacturing challenges as well. One troubling issue is the normal process variations that occur during manufacturing can cause the final laser devices to have a wider range of output wavelengths than is desired. Many thousands of devices are made on a single manufacturing 'wafer' or substrate disc. It is not unusual for the wavelengths of devices that come from the same wafer to vary randomly by +/−10 nano-meters or more, even for a process that is well controlled. They may be distributed with a normal statistical distribution around the mean or they may be heavily skewed in either direction from the targeted/desired center wavelength. If it is desirable to hit a specific center wavelength very precisely, like +/−1 or 2 nano-meters, the only choice is normally to sort the devices individually and pick only the devices which are in the tight desired range. This can mean that perhaps 80% or more of a production lot would need to be thrown away. Of course, sometimes they can be used for another application that needs an adjacent wavelength, but this is not a reliable business plan for most situations. This sorting procedure could easily cause the production yield to be below 20% when all the other production causes for fallout are included. This is a major problem for high-production, high-powered use of such devices. Producing vast numbers of devices that are at the specified wavelength is required for the best economics and for solid commercialization of various products which may desire to apply DHI technology.

The design of traditional diode lasers necessitates a number of manufacturing steps which make it more expensive to integrate into an application and more expensive and involved to automate. The first aspect is that most diode lasers are chemically fabricated in an MOC-VD wafer fabrication machine with a layering approach. The ultimate lasing direction of each device is typically parallel to the plane of the wafer. The thousands of devices that are yielded from a single wafer by either saw cutting or scoring and cleaving to dice them into individual devices. Sometimes instead of cutting them into individual devices they are left physically connected as a row of devices which is then known as a laser bar. The bar may contain N lasers but might typically be 20 or more different laser devices, each of which functions individually. They are still mechanically joined to their neighbors because they were never separated from them. Whether it's a 'bar' configuration or whether it's an individual laser diode device for conventional 'edge emitting' lasers, it is necessary to perform polishing and other processes to the edges or ends of each device, one of which will become the emitting facet. The vast majority of all diode lasers are manufactured as these 'edge emitting type' devices. In an improved design, all this additional processing and care for the edges would beneficially be eliminated from the manufacturing process in order to eliminate production steps and costs.

Figure 5:
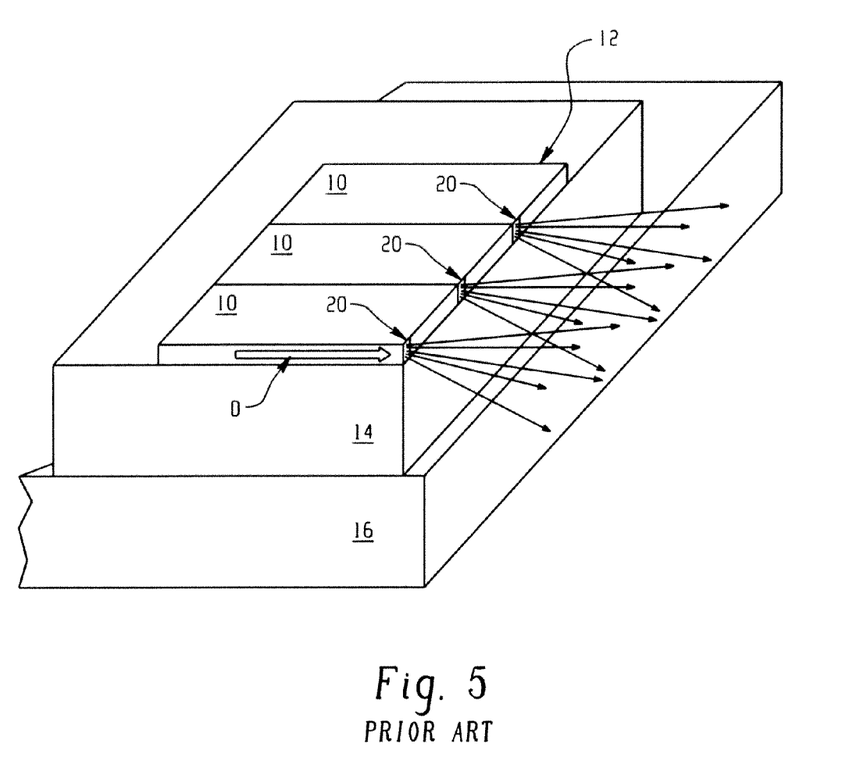
FIG. 5 is a prior art configuration.

With reference to FIG. 5, typical edge-emitting devices 10 are shown in a bar 12 disposed on substrates 14 and 16. Substrate 14 (and/or 16 in some applications) may be a cooling substrate or system. Also, line D shows the general direction of the beam as it is generated in the wafer—to be output ultimately at a facet 20. The emitting facet 20 (three examples of which are shown) is the surface which ultimately is the site of the most common cause for failure in laser diodes. The emitting facet 20 is fragile and critical to the life of a laser diode. Any nick, scratch, imperfection, contaminant and some other issues on that surface can lead to additional local or large scale heating which in turn leads to failure. This is known typically as 'catastrophic facet failure' and is the most common failure mode in semi-conductor lasers. Also, the facet is generally rectangular in shape so issues of control and output consistency arise relative to the fast and slow axes of the laser output.

Figure 6A:
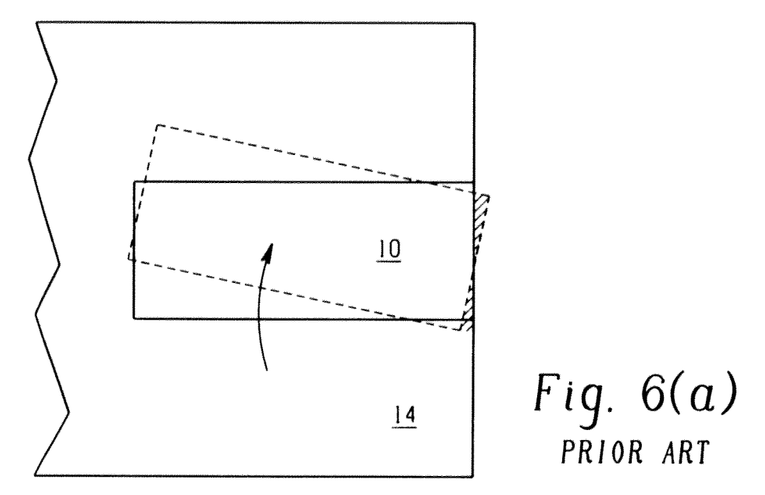
FIGS. 6(a)-(b) are prior art configurations.
Figure 6B:
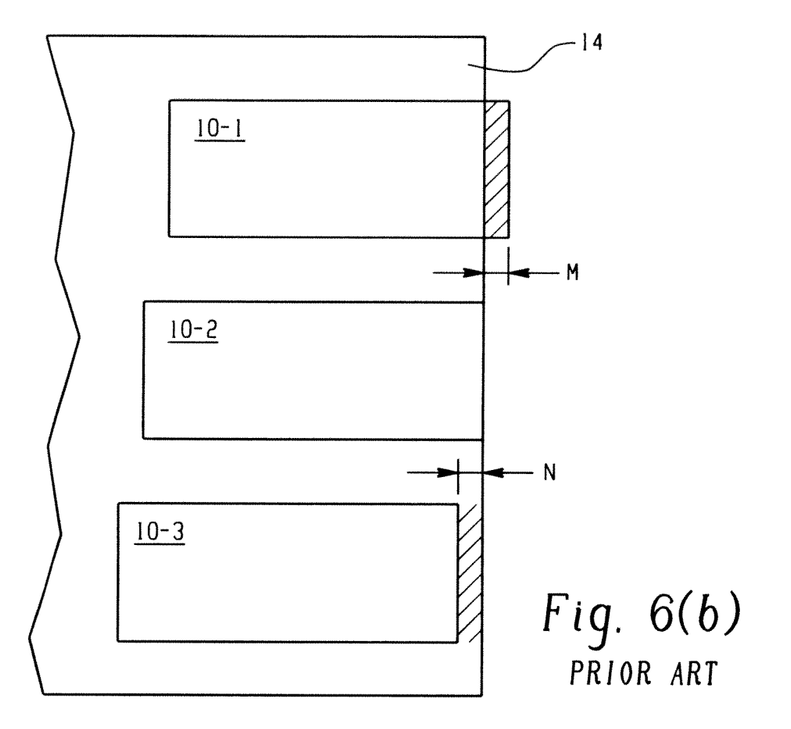

With reference to FIGS. 6(a) and 6(b), another problem encountered during the manufacturing mounting of traditional edge emitting laser devices 10 is the following. To maximize the life and output of diode lasers, it is necessary to cool them adequately and evenly. Lasers that put out any substantial amount of power should properly be mounted to some sort of heat dissipating substrate, e.g. substrate 14, on at least one side of the laser diode. For best cooling and maximum device life, the surface of the facet 20 must be absolutely flush and parallel (as shown by device 10-2 of FIG. 6(b)) to the edge of the heat sinking, cooling substrate 14. If the laser diode is at any skewed angle relative to the edge of the substrate or is not nearly perfectly flush (FIG. 6(a)), bad things begin to happen from a cooling standpoint which leads to early failure. If any portion of the substrate 14 (for example) protrudes beyond the facet surface by a distance N then it creates a location where contaminants can reside (as shown by device 10-3 of FIG. 6(b)) and the protruding substrate becomes a reflector/absorber of stray rays which come out of the emitting facet. Both conditions can lead to substantial additional heating of the facet material nearest the substrate. Also, if the facet 20 protrudes beyond the plane (by a distance M) of the cooling substrate 14 as shown by device 10-1 of FIG. 6(b), it prevents the substrate from sinking heat out of the laser device which can also lead to uneven heating and overheating of the critical facet area of the laser diode. Similarly, any interface medium or coating which has been superimposed between the cooling substrate or cooling circuit board and the laser diode(s) can either not come all the way out to flush or could ooze out and cause an overhang material situation. This also, like the other conditions, can lead to or contribute to catastrophic facet failure. To eliminate these problems it would be very desirable to incorporate a laser diode which can be mounted quickly and cost effectively without concern for the issues just described.

Since many DHI applications utilize more than one laser diode in order to get enough radiated energy to the target, the mounting complications and number of diodes required can raise the cost of manufacturing DHI systems substantially. Hence, another limitation of the current technology is the limited power that can be produced from a single laser diode. If the laser diodes are driven harder or designed as larger packages in order to get more power output, it raises the power density that must pass through the output facet. As the power density rises, the heat that is inevitable must be dissipated more carefully. The compromise that is often taken de-rates the devices to keep the efficiency and longevity reasonable.

Carefully controlling the temperature of the laser devices or laser arrays is not only critical to the life of the devices but it is critical in other ways as well. As the temperature of laser diodes goes up, the radiant output goes down. Also, as the temperature changes, the wavelength of the radiant output of the laser diode device changes as well. For most traditional semi-conductor lasers the output changes by 0.3 nanometer per degree centigrade change in junction temperature. This is problematic because in a DHI system it is more expensive and may use more energy to precisely control the temperature of the devices.

The list of substantial issues, as detailed above, are challenges that a practitioner of digital heat injection technology will encounter when trying to commercialize a system which fundamentally is built around conventional, edge emitting laser diodes and some other narrowband devices economically which gave rise to the novel thinking represented by the present invention.

SUMMARY

In one aspect of the presently described embodiments, the system comprises a means operative to locate a target in an irradiation zone facilitating the application of radiant heating into the target, at least one semi-conductor based narrowband radiation emitting device element, the at least one narrowband radiation emitting device being operative to emit radiation at a narrow wavelength band of radiant heat output which matches a desired absorptive characteristic of the target, the at least one narrowband radiation emitting device being a mounted surface emitting laser diode device, the at least one narrowband radiation emitting device being mounted to a mounting entity comprising at least one of a circuit board and a cooling substrate such that the central axis of an irradiation pattern from the at least one narrowband radiation emitting device is directed generally orthogonally relative to the largest plane of the mounting entity, the mounting arrangement configured to position the at least one narrowband radiation emitting diode device such that irradiation therefrom is directed to a target in the irradiation zone, and a means operative to supply electrical current to the at least one narrowband radiation emitting device.

In another aspect of the presently described embodiments, the at least one semiconductor-based narrowband radiation emitting device element forms an array of more than one surface emitting laser diode devices.

In another aspect of the presently described embodiments, the array comprises an X by Y matrix of surface emitting laser diode devices wherein both X and Y are greater than one (1).

In another aspect of the presently described embodiments, the array is in the form of an engineered array of more than one surface emitting laser diode devices such that the relative geometrical locations have been determined with consideration of the irradiation output pattern of the combination of the laser diode devices to provide better irradiation of the intended target which is to be irradiated.

In another aspect of the presently described embodiments, one of a lensing or reflector arrangement is superimposed between the array and the target for the purpose of improving the irradiation pattern at the point where the irradiation reaches the intended target.

In another aspect of the presently described embodiments, devices are included in the array of at least two different device types, the device types being defined by at least one of producing different wavelengths, being manufactured from different wafer substrate chemistry, of different physical sizes, different power outputs and of differing device output patterns.

In another aspect of the presently described embodiments, the array of at least two different device types is characterized by being three or more different device types.

In another aspect of the presently described embodiments, the different device types which are included in the array can produce at least two different wavelengths, the center of which wavelengths are within 100 nm from one another.

In another aspect of the presently described embodiments, the different device types which are included in the array can produce at least two different wavelengths, the center of which wavelengths are more than 150 nm from one another.

In another aspect of the presently described embodiments, the means operative to supply electrical current to the at least one narrowband radiation emitting device is comprised of a system which can selectively supply current by way of at least one current controlling power supply which can be controlled by an intelligent controller, the intelligent controller which controls the power supply consists of at least one of a programmable logic controller, a microprocessor-based control board, a computer control system, and an embedded logic controller.

In another aspect of the presently described embodiments, the intelligent controller has the ability to selectively control the irradiation from the at least two different device types.

In another aspect of the presently described embodiments, the intelligent controller is operative to digitally control the radiation from the at least one narrowband radiation emitting devices wherein the devices are configured to irradiate more than one irradiation zone on the target.

In another aspect of the presently described embodiments, the intelligent controller is operative to digitally control the radiation from the at least one narrowband radiation emitting devices wherein the devices are configured to irradiate at varying wavelengths corresponding to different absorption characteristics of the target.

In another aspect of the presently described embodiments, the geometrical arrangement of the surface emitting laser diode devices is arranged so that the irradiation output pattern does not require the superposition of any refracting, diffracting, or reflecting device between the laser diode devices and the irradiation target.

In another aspect of the presently described embodiments, the at least one of a circuit board and cooling substrate have more than eight surface emitting devices mounted thereon.

In another aspect of the presently described embodiments, the at least one narrowband radiation emitting device consists of an integrated circuit chip array of more than one surface emitting devices which were manufactured at the wafer level as a unit.

In another aspect of the presently described embodiments, the lasing inside each laser diode device occurs in a direction parallel to the mounting plane of the devices while the central axis of the output irradiation pattern is generally orthogonal thereto.

In another aspect of the presently described embodiments, the output irradiation pattern of at least some of devices is collimated photonic energy in at least one of its two fundamental 90° opposed axes.

In another aspect of the presently described embodiments, no component of the external irradiation pattern of each device is parallel to the largest plane of the laser diode device itself.

In another aspect of the presently described embodiments, no component of the external irradiation pattern of each device is parallel to the largest plane of the mounting substrate.

In another aspect of the presently described embodiments, the control includes the ability to control how much accumulated energy is irradiated to specific regions of the target.

In another aspect of the presently described embodiments, the central output wavelength of the devices is affected by less than 0.1 nanometer per degree centigrade of laser diode device operating temperature change.

In another aspect of the presently described embodiments, the system comprises at least one semi-conductor based narrowband radiation emitting device element, the at least one narrowband radiation emitting device being operative to emit radiation at a narrow wavelength band of radiant heat output which matches a desired absorptive characteristic of the target, the at least one narrowband radiation emitting device being a mounted surface emitting laser diode device, the at least one narrowband radiation emitting device being mounted to a mounting entity comprising at least one of a circuit board and a cooling substrate such that the central axis of an irradiation pattern from the at least one narrowband radiation emitting device is directed generally orthogonally relative to the largest plane of the mounting entity, the mounting arrangement configured to position the at least one narrowband radiation emitting diode device such that irradiation therefrom is directed to a target in the irradiation zone, and a means operative to supply electrical current to the at least one narrowband radiation emitting device.

In another aspect of the presently described embodiments, the at least one semiconductor-based narrowband radiation emitting device element forms an array of more than one surface emitting laser diode devices.

In another aspect of the presently described embodiments, the array comprises an X by Y matrix of surface emitting laser diode devices wherein both X and Y are greater than one (1).

In another aspect of the presently described embodiments, an irradiation array for the production of radiant energy associated with a target comprises semi-conductor irradiation array wherein the devices are not mounted, flush with any edges of a board upon which the array is mounted, wherein the mounting board is configured as a high head conduction substrate which has at least one layer to conduct heat and one layer to conduct electrical supply current, wherein the array is comprised of surface emitting, semi-conductor laser devices, wherein the axis of the optical photonic output of the array of devices is substantially perpendicular to the large plane of the mounting substrate, and, wherein the mounting board is configured to thermally couple to at least one of a water jacket cooling system, a heat radiation fin arrangement, a state change cooler, a compressed media cooler and a thermoelectric cooler.

In another aspect of the presently described embodiments, the array is a X by Y array of surface emitting devices whereby both X and Y is greater than one.

In another aspect of the presently described embodiments, the array is an arrangement of surface-emitting devices whereby some of the devices are rotated relative to their neighboring devices.

In another aspect of the presently described embodiments, the method comprises introducing a target item into an irradiation zone, emitting radiation at a narrow wavelength band of radiant heat output which matches a desired absorption characteristic of the target item using a mounted surface emitting laser diode device, wherein the mounted surface emitting laser diode device is mounted to a mounting entity comprising at least one of a circuit board and a cooling substrate such tat a central axis of an irradiation pattern from the device is directed generally orthogonally relative to the largest plane of the mounting entity, and irradiating the target item based on the irradiation device.

In another aspect of the presently described embodiments, the target item is a food item.

In another aspect of the presently described embodiments, the target item is a preform plastic bottle.

DETAILED DESCRIPTION

The present invention describes a new use of a documented but not well known laser diode technology. This is a new class of devices that are just emerging from a few advanced manufacturers as experimental devices and as a class are known as surface emitting diode lasers. They have unique properties for practicing digital heat injection technology and they have none of the limitations indicated above. Although they may not represent a substantial improvement for many traditional uses of laser diodes, they represent a substantially novel improvement in both the economics and the practicality of practicing digital heat injection technology.

The design and manufacture of DHI applications typically involves a large number of laser diode devices for each system—since they are often involved in the radiating relatively large surface areas and heating target items with a substantial amount of energy. Many of the traditional applications for power laser diodes use small numbers of laser diodes and can justify more costly non-automated methods of mounting. Conversely, for many DHI applications to be practical, it is necessary to use highly automated manufacturing methodologies and to drive the cost down through the best practices of high volume manufacturing. Device and manufacturing costs are so important to DHI applications that the number of applications which can be justified by customers is inversely proportional to the manufacturing cost which is largely driven by the cost of the mounted devices. It is for this reason that the inventors here have sought a novel way of implementing laser diodes as a critical step in making the technology cornmercializable.

The implementation of this type of surface emitting device has the advantage of not requiring precision alignment at all relative to the edge of a cooling circuit board or substrate. This is made possible because it emits the energy orthogonal to the plane of the manufacturing wafer from which it originates. The actual lasing takes place parallel to the surface but the energy is emitted from the laser diode device perpendicular to the lasing direction. Since it is not the normal edge emitting device, it eliminates concerns about the tiny, fragile facet and all the issues associated therewith.

It has the further advantage of having an emission facet, on the plane of its largest or mounting surface, which is many times the size of the facet of an edge emitting device. This reduces the energy density through the facet dramatically and, therefore, increases reliability substantially. In some designs the energy density has been shown to be up to three orders of magnitude less with the surface emitting arrangement compared to edge emitting devices. This typically should result in substantially longer life and improved, more economical and efficient cooling configurations. One of the reasons cooling is simplified is that the direction of output can be perpendicular to the mounting board—so cooling can be accomplished for many devices in the same plane.

The present invention has the further advantage of having an aperture that grows proportionally with the geometric proportions of the device so that very high power output devices are possible with low energy density through the emitting facet.

It has the further advantage of emitting irradiation energy, in at least one form, which is already collimated in one axis while having only a modest divergence angle in the other axis. This allows for very easy handling of the radiant energy output and thus the use of simpler and more inexpensive lenses or optical devices (such as cylindrical lens bars made of relatively inexpensive material). In fact, this feature eliminates the need for any lensing in many DHI applications. This, is a further cost reduction for a fully configured system. This also allows for better zone control of the output of, for example, arrays of devices designated for different target zones.

It has the further advantage of having very tight control of the wavelength of irradiation. The typical production variations across a wafer are only plus/minus one or two nano-meters which is tight enough to eliminate the need for sorting to a specific wavelength for even the most critical DHI applications. With production sorting being unnecessary to have a very high yield, there is another substantial cost reduction benefit for the typical high volume DHI application. So, a digital heat injection system using these devices has a large surface area of emission for high reliability but at a natively precise wavelength.

Yet another advantage of the current invention is that changes in temperature have at least an order of magnitude less effect on the wavelength output of the device. The output variation is typically about 0.03 nano-meters of change per degree centigrade of junction temperature change. This is a significant advantage because it makes the cooling far less critical and makes simpler, less expensive cooling techniques practical for many of the DHI applications. For example, sophisticated chillers may not be required but rather air cooling by way of heat sink fins may be adequate for many applications. Also the heat sinking substrate can typically be of a much less sophisticated design which is a terrific cost saving reality.

A further advantage is that the contemplated surface emitting devices can be mounted on a mounting entity with more conventional, less precision pick and place type equipment more similarly to the way other, non-optical circuit board components might be mounted.

Also, because the output of the devices is perpendicular to the mounting board, electrical connection can be made easier. Yet another advantage of the invention is the rejection of irradiation photons that are reflected back to the laser device so that the stray light is extremely unlikely to cause damage to the junction area inside the laser device.

And yet another advantage is that the form factor of the surface emitting devices lends to manufacturing the devices in extremely high-powered, single device versions. For example, a single diode laser could be manufactured which would be in excess of 75 watts.

Yet another advantage of the surface emitting devices is that they can be manufactured in both gallium arsenide substrate and indium phosphide substrates to facilitate use in a broad range of DHI applications.

Figure 1A:
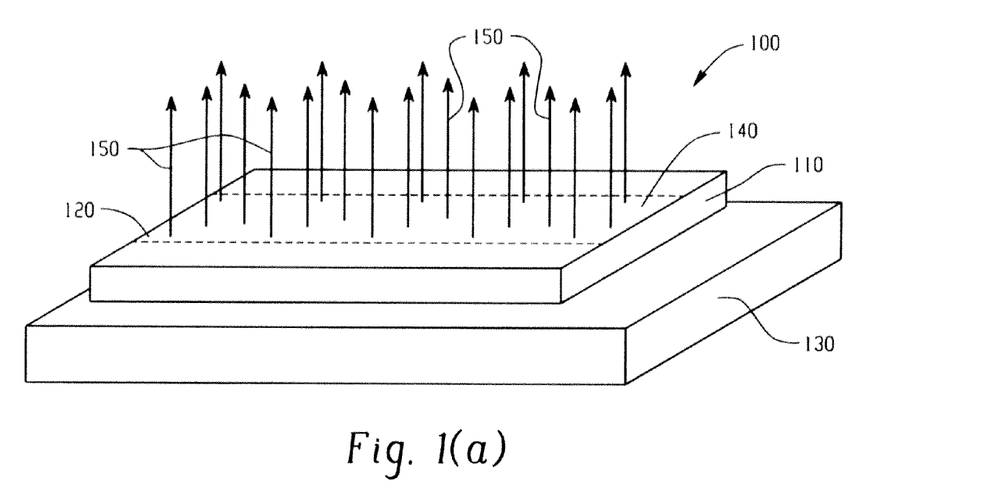
FIGS. 1(a)-(d) are representations of a surface emitting device.
Figure 1B:
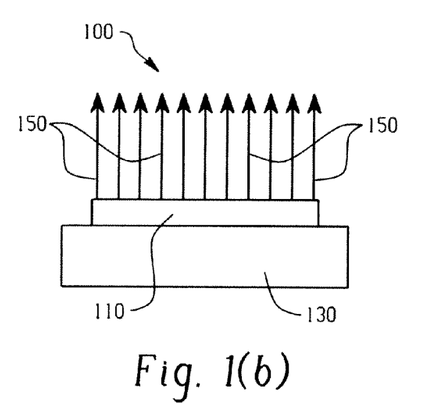
Figure 1C:
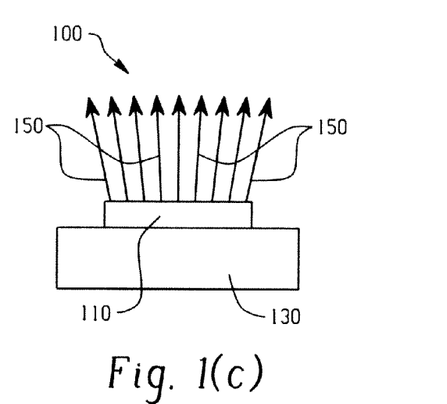

With reference now to FIGS. 1(a)-(c), a surface emitting distributed feedback semi-conductor laser diode device 100 is illustrated. This device may be manufactured in a variety of different manners as is described in a variety of publications but, in one form, may be manufactured according to, for example, U.S. Pat. Nos. 5,345,466, 5,867,521, 6,195,381 and U.S. Publication No. 2005/0238079. All of these documents are incorporated in their entirety herein by this reference.

Briefly, in one example form and without limitation, the device 100 will typically include a laser diode portion 110 including an emitting surface 120. Notably, the fabrication of the diode also includes the provision of a cooling substrate 130.

In addition, the emitting surface 120 includes an emitting zone 140 to advantageously emit, in a predetermined direction, radiation 150. Notably, the device 100 is able to achieve such performance and functionality, in part, because of an underlying grating surface (not shown). In this regard, the grating may be curved in nature.

Figure 1D:
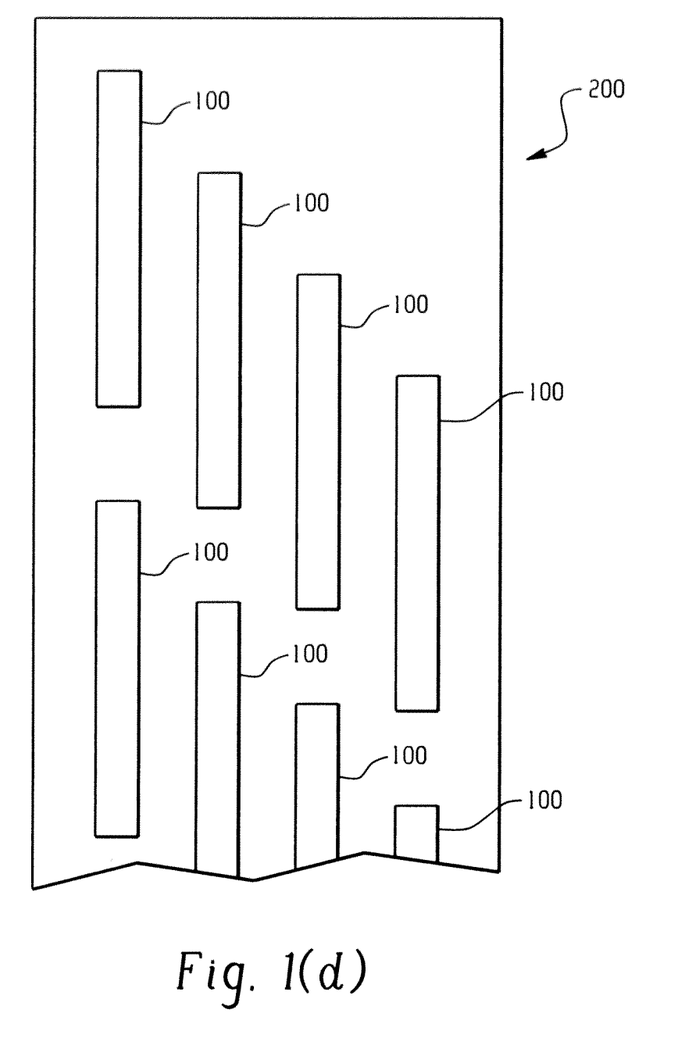

With reference now to FIG. 1(d), the devices 100, or variations thereof, are shown as being distributed in an example array 200. The device 100 is shown as being distributed in such a manner so as to provide no gaps in radiation for the array. The configuration of the array, and the number of arrays used, will allow, in some forms, for advantageous control of zones of the arrays so that such zones can be controlled in an appropriate manner. Also, it may advantageous to provide arrays, or groups of arrays connected electrically in series to achieve a desirable drive voltage. This is substantially advantageous in practicing digital heat injection so that the wire size can be kept to a reasonable gauge. Large diameter wires would be required to drive a high wattage at a low voltage because of the high current requirement. The large diameter wires are more expensive as well as substantially more difficult to work with and to connect. In contrast, all of the laser diodes in a laser diode bar will, by physical constraint of their packaging, be in electrical parallel with one another. Given the way they must therefore be cooled and mounted, it is more challenging to achieve the convenience of a series of electrical connection for a DHI configured array.

As noted above, surface emitting distributed feedback semi-conductor laser diodes, such as the device 100, have distinct advantages over more traditional laser-type devices. As can be seen, alignment of the laser diode portion 110 on a cooling substrate 130 is no longer difficult. It does not require a precision edge alignment. Also, as shown in FIGS. 1(b) and 1(c), the radiation emitted from the emitting surface 120 is collimated in one dimension (FIG. 1(b)—side view) and is a gently angled divergence in the other dimension (FIG. 1(c)—end view). This is unlike most laser diodes which have a fast axis and a slow axis of divergence. This has the distinct advantage in the contemplated DHI applications that the lensing (if necessary) of the radiation becomes simplified in one dimension, thus facilitating a much simpler form of lensing and/or improved control of zones in many applications. Also, the tolerance of these devices is on the order of plus or minus one nanometer per wafer—as opposed to much greater tolerances of more traditional laser devices. So, a significant advantage of the device 100 is that the narrowed range of operation will allow for application of energy in an absorption range of a target that lies on a very "steep" portion of its absorption curve.

FIGS. 1(a)-(d) show one example embodiment of a device that may be implemented to achieve the objectives of the presently described embodiments. However, the surface emitting device, according to the presently described embodiments, may take a variety of forms. Devices such as these will typically have an emitting zone that comprises greater than 35% (or so) of the emitting surface (which may be a surface having the target dimensions on the device) that is perpendicular to the direction of the output.

Figure 2A:
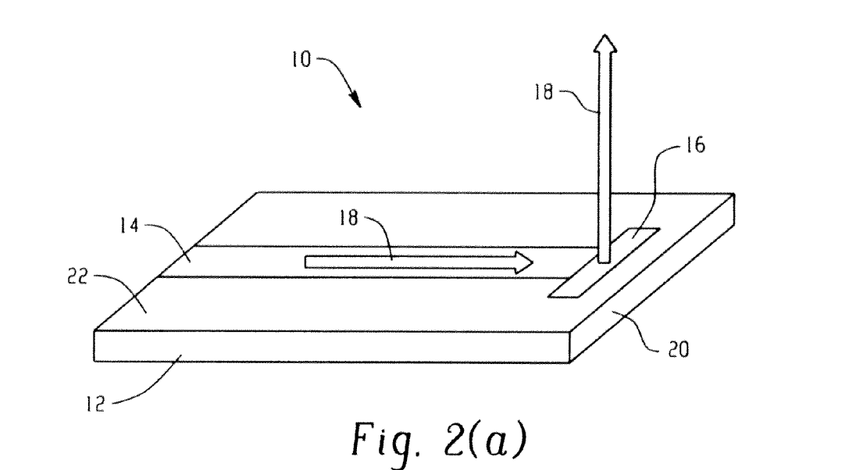
FIGS. 2(a)-(b) are representations of another surface emitting device.
Figure 2B:
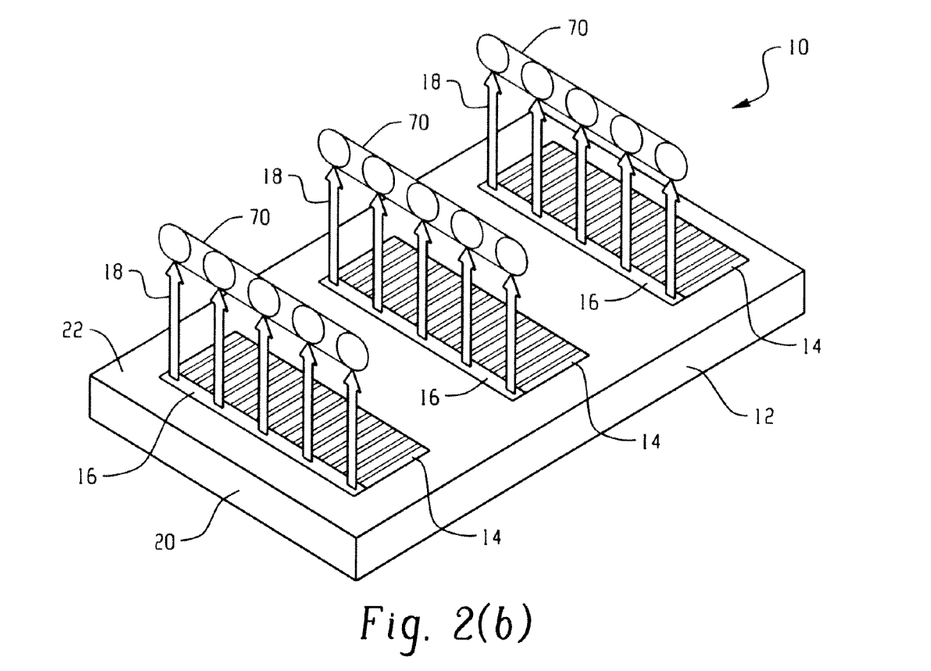

Another example of a surface emitting device that can be advantageously implemented within the presently described embodiments is shown in FIGS. 2(a) and 2(b). Such devices are disclosed in U.S. Application Nos. 2004/0066817 and 2005/0180482—both of which are incorporated herein by reference in their entirety.

As shown, a surface emitting device 10 comprises a semiconductive die or substrate 12 that contains a laser strip 14 and a reflective element 16. A laser beam 18 is generated in the laser strip 14 and reflected off the element 16 so that the laser beam 18 is emitted from the device 10 and a direction generally perpendicular to the surface 22 of the substrate 12. In one form, as shown, the laser beam 18 travels in a direction toward an edge 20 of the device. With reference to FIG. 2(b), the device as shown in FIG. 2(a) is arranged in an array. The array or arrays can be configured in a variety of manners to achieve the objectives of the presently described embodiments. However, in at least one form, several devices 10 are arranged adjacent to one another to form a column or a row and a plurality of columns or rows are provided on a particular substrate. Also, as can be seen, the plurality of devices that form the arrays generally emit radiation in a direction perpendicular to the surface 22 of the substrate 12 to provide regions 70 of radiation beams.

The devices illustrated in FIGS. 2(a) and 2(b) are subject to many of the same advantages as the devices illustrated in FIGS. 1(a)-1(d). One difference in implementation of the device of FIGS. 2(a) and 2(b) is, however, that the light emitted from the device 10 is not necessarily collimated in one direction as with the devices of FIGS. 1(a)-1(d). It also does not maintain as large an aperture as the device designed in FIGS. 1(a) through 1(d). However, the device of FIGS. 2(a)-2(b), like the device of FIGS. 1(a)-1(d), does include a larger surface area of emission at a precise wavelength. Moreover, the direction of emission is orthogonal to the large axis or face of the device. This means in many DHI applications the plane of the mounting circuit board can be orthogonal to the direction of irradiation. In this orientation the radiant emission from the laser devices can be directly facing the target. Therefore, the lensing arrangement of such a system, whether it be in one dimension or two dimensions, is greatly simplified over other types of laser diode implementations. Importantly, both configurations of surface in emitting devices from both FIGS. 1(a)-(d) and from FIGS. 2(a)-(b) maintain all the ease of mounting considerations that are described above. This will be described in greater detail in connection with FIGS. 3(a)-(d) and 4.

Moreover, it should be appreciated that the surface emitting devices as implemented in connection with the presently described embodiments are, in at least one form, configured wherein the lasing inside each laser diode device occurs in a direction parallel to the largest (or mounting) plane of the device while the central axis of the output irradiation pattern is generally orthogonal to the largest (or mounting) plane of the device. In at least one form, the output irradiation pattern of at least some of devices is collimated photonic energy in at least one of its two fundamental 90° opposed axes. In at least one form, no component of the external irradiation pattern of each device is parallel to the largest (or mounting) plane of the laser diode device itself. Also, in at least one form, the central output wavelength of the devices is affected by less than 0.1 nanometer per degree centigrade of laser diode device operating temperature change.

Figure 3A:
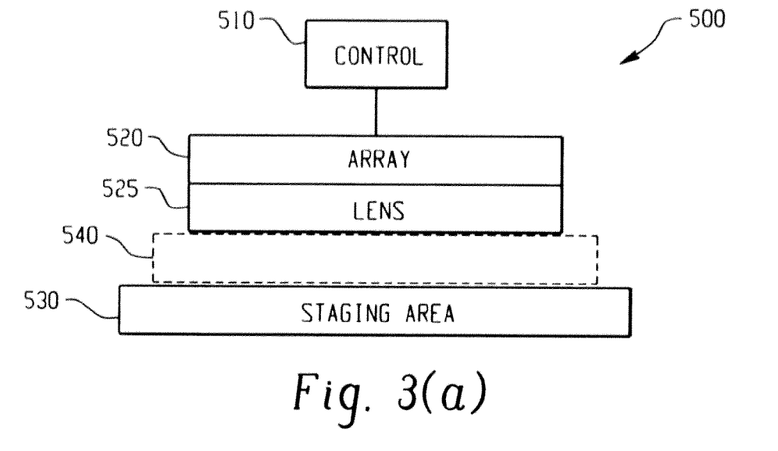
FIGS. 3(a)-(d) are a system according to the presently described embodiments.

With reference now to FIG. 3(a), a system into which the presently described embodiments are incorporated as shown. The system 500 includes a control module 510 as well as an array 520 and a lens arrangement 525 (if necessary). The array 520 may take any of the forms contemplated herein and radiates a staging area 530 to create an irradiation or target zone 540.

It should be appreciated that the control module 510 may take a variety of forms, including that of an intelligent controller to control a current controlling power supply that controls current to the surface emitting devices. It should be appreciated that the control module may include or control the means or mechanism or system to supply electric current to the surface emitting devices. The intelligent controller may be a programmable logic controller, a microprocessor-based control board, a computer control system or an embedded logic controller. The intelligent controller has the ability to selectively control the irradiation from the at least two different device types. The intelligent controller has the ability to separately control the radiation from the at least one narrowband radiation emitting devices wherein the devices are configured to irradiate into more than one irradiation zone on the target. Therefore, the control module 510, in many forms, has the ability to control how much accumulated energy is irradiated to specific regions of the target.

The array 520 may take a variety of forms. However, in at least one form, the array comprises at least one semi-conductor based narrowband radiation emitting device element, wherein the at least one narrowband radiation emitting device is operative to emit radiation at a narrow wavelength band of radiant heat output which matches a desired absorptive characteristic of the target and is a mounted surface emitting laser diode device. In at least one form, the devices are configured to irradiate at varying wavelengths corresponding to different absorption characteristics of the target or targets. The at least one narrowband radiation emitting device may be mounted to a mounting entity such as a circuit board and/or a cooling substrate such that the central axis of the irradiation pattern from the at least one narrowband radiation emitting device is directed generally orthogonally relative to the largest plane of the mounting entity. The mounting arrangement may be configured to position the at least one narrowband radiation emitting diode device such that irradiation therefrom is directed to a target in the irradiation zone. Also, the at least one semi-conductor-based narrowband radiation emitting device element is formed in an array of more than one surface emitting laser diode devices. The array, in one form, comprises of an X by Y matrix of surface emitting laser diode devices—wherein both X and Y are greater than one (1). The array is, in one form, in the form of an engineered array of more than one surface emitting laser diode devices such that the relative geometrical locations have been determined with consideration of the irradiation output pattern of the combination of the laser diode devices to provide better irradiation of the intended target which is to be irradiated. In at least one form, devices are included in the array of at least two different device types, the device types being defined by at least one of producing different wavelengths, being manufactured from different wafer substrate chemistry, of different physical sizes, and different power outputs. The array of at least two different device types may be characterized by being three or more different device types. In at least one form, the different device types which are included in the array can produce at least two different wavelengths, the center of which wavelengths are within 100 nm from one another or are more than 150 nm from one another.

Also, it should be appreciated that an irradiation array for the production of radiant energy associated with a target according to the present invention includes a semi-conductor irradiation array wherein the devices are not mounted flush with any edges of a board upon which the array is mounted. The mounting board is configured, in one form, as a high head conduction substrate which has at least one layer to conduct heat and one layer to conduct electrical supply current. The array is comprised of surface emitting, semi-conductor laser devices wherein the axis of the optical photonic output of the array of devices is substantially perpendicular to the large plane of the mounting substrate. The mounting board is also configured, in one form, to thermally couple to at least one of a water jacket cooling system, a heat radiation fin arrangement, a state change cooler, a compressed media cooler and a thermo-electric cooler.

In addition, the devices may be positioned on a substrate in a variety of manners. For example, rows and columns of devices may be provided wherein the devices are all oriented in the same manner, i.e. the length (or widths) directions of all devices being parallel. Rows or columns may also be offset (as in FIG. 3(b)). Further, alternating devices in rows and/or columns may be rotated by, for example, 90° so that length (or widths) directions of neighboring devices are orthogonal to one another. In at least one application, such rotation of alternating devices allows for a more uniform irradiation field.

Also, the arrays may be formed on circuit boards or cooling substrates so that any number of surface emitting devices can be formed thereon. An example array would have eight (8) surface emitting devices thereon. Also, the array may be an integrated chip array of multiple devices that were manufactured at the wafer level as a unit.

With respect to the optional lens arrangement 525, as noted above, it will be appreciated that this lensing arrangement may take a variety of forms but, in at least one form, it is a simplified lensing arrangement when compared to that which is known relative to laser diode applications. In this regard, the surface emitting nature of the device allows for the emitting surface to directly face the target areas, that is, the emission is orthogonal to the plane of the mounting substrate. This reduces the need for complicated optics systems. Therefore, in many cases a simple cylindrical lens, for example, placed in front of the devices will suffice for lensing applications. In this regard, a single cylindrical lens for multiple devices or a separate lens for each device could be implemented. Also, because surface emitting devices generally have a larger facet area and less power density, less expensive lens arrangements and materials can be implemented. These advantages become desirable in DHI applications where large surface areas of emission at precise wavelengths are satisfactory. High energy density that is typically desired in laser applications is not necessary in DHI applications.

Of course, although a variety of configurations are possible, in one form, one of a lensing or a reflector arrangement is superimposed between the array and the target for the purpose of improving the irradiation pattern at the point where the irradiation reaches the intended target. In other forms, the geometrical arrangement of the surface emitting laser diode devices is arranged so that the irradiation output pattern does not require the superposition of any refracting, diffracting, or reflecting device between the laser diode devices and the irradiation target.

The staging area 530 and irradiation or target zone 540 may also take a variety of forms. In one form, the staging area includes a conveyor or carousel to move targets into the zone 540 to be irradiated. The staging area 530 may also be a stationary plate or other support element. In some forms, the staging area may be stationary but the array (and lens, if included) moves relative to the target. Of course, the configuration is a function of the application.

It would be appreciated by those of ordinary skill in the art that system 500 of FIG. 3, may take a variety of forms and implementations. For example, the system 500 may take the form of a system for heating preform plastic bottles during the blow molding process. In another form, the system 500 could be positioned in an oven for baking various types of food items.

Figure 3B:
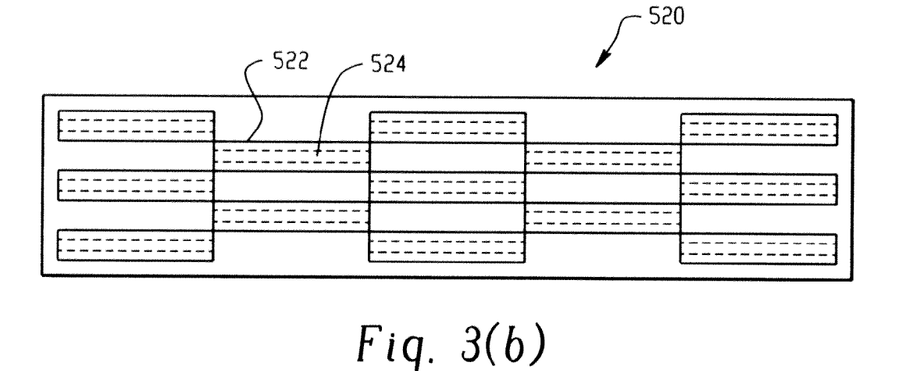
Figure 3C:
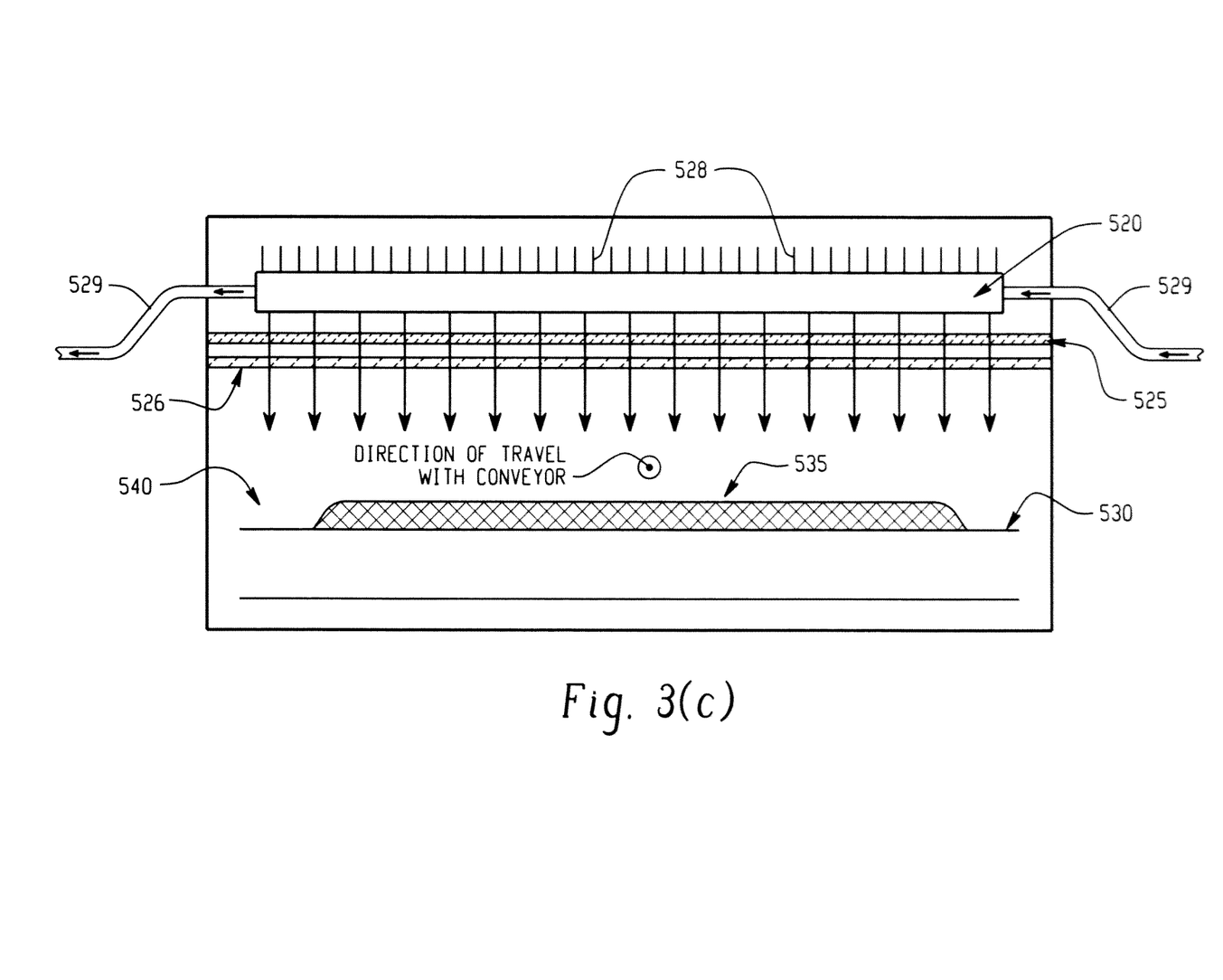

In this regard, with reference to FIGS. 3(b) and (c), an example of an implementation of the device of FIG. 3(a) is illustrated. It should be appreciated that the device or system illustrated in FIGS. 3(b) and 3(c) is merely exemplary in nature and may take a variety of other forms. As noted above, a target 535 is shown in FIG. 3(c). This target could take a variety of forms including that of a plastic preform bottle or a food item such as a pizza. It should also be appreciated that variations in the target object may require variations in the system (for example, changes to the conveying system or staging area) that should be apparent upon the study of the present disclosure.

More specifically, FIG. 3(b) illustrates an example form of the array 520. As shown, the array 520 has a plurality of surface emitting devices 522 disclosed thereon. Each surface emitting device includes an emitting surface or zone such as that shown at 524. Array 520 shown in FIG. 3(b) illustrates that a substantial emitting surface can be realized on a circuit board to emit radiation toward an object. As shown, the array 520 would allow for uniform output to be emitted toward a target traveling in a direction that is perpendicular to the long side of each of the devices 522. The devices such as the device 522 would be arranged or controlled in a variety of manners. For example, each set of two or three devices arranged in the columns as shown may be considered and controlled as a separate emission zone. In other embodiments, zone control may not be a priority, however, efficiency of configuration and cooling may dictate the pattern. As noted above, because the devices such as 522 may be arranged on a circuit board or cooling substrate to output energy in a direction perpendicular to emitting surfaces, improved performance is obtained. These improvements are not obtainable using edge emitting laser diodes, as should be apparent from the disclosure herein.

With reference now to FIG. 3(c), the array 520 is shown in an orientation whereby the emitting surfaces emit radiation toward an object 535 that resides on staging area 530 within a heating zone 540. For purposes of this illustration, it should be noted that the direction of travel of the object 535 is into/out of the page as indicated by the dot. In connection with the array 520, a lens or lens arrangement 525 is also shown. The lens 525 may take a variety of configurations. However, the use of surface emitting devices allows for the lensing device 525 to take on a relatively simple and inexpensive configuration. In this regard, the lens may be a simple cylindrical lens formed in a bar that is sized to advantageously distribute the energy emitted from the array 520. It should be appreciated that the lens arrangement 525 is merely an optional feature for any given application. It should also be appreciated that the relative location of the lens 525 from the surface of the array may dictate the pattern that is seen at the output or the target 535. For example, this is a function of the arrangement of the devices 522 on the lens array 520. Those of skill in the art will appreciate the manner in which the lens distributes energy and focuses energy as may be desired. In any case, the use of surface emitting devices allows for a greater flexibility in the use and configuration of the lens because the more favorable energy distribution of the surface emitting devices allows the lens arrangement to be placed in closer proximity to the emitting surface. This cannot be accomplished using edge emitting devices for at least the reason that edge emitting devices may create too much heat and create hot spots on or in the lens that would not be advantageous to proper performance.

The array 520 is also shown with cooling lines 529 and cooling fins 528. The simplicity of the arrangement of the cooling devices illustrates still further advantage of the use of surface emitting devices whereby the devices emit in a direction perpendicular to the emission surfaces and the largest plane of the substrate or mounting entity. This allows for simplified cooling arrangements as shown herein.

Also shown is a protective shield 526. The protective shield 526 could take a variety of forms. However, in at least one form, the protective shield 526 is made of a material that will be transparent at desired wavelengths but also protect the array from undesired wear.

Figure 3D:
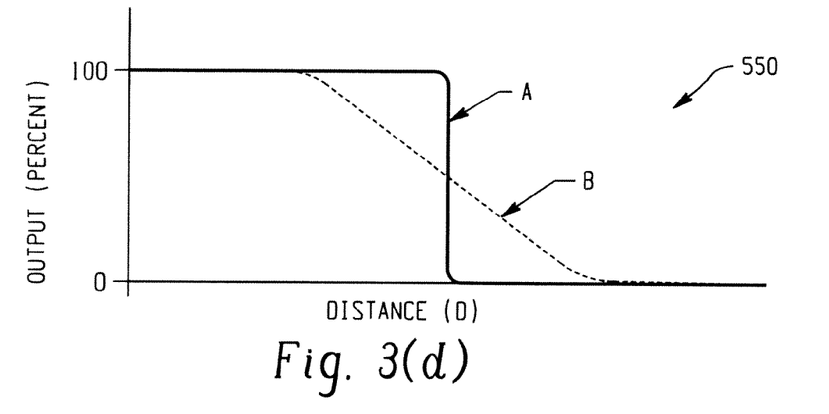

Referring now to FIG. 3(d), a graph 550 is shown. In the graph, a percentage of output as seen at a target is graphed against a distance D that spans at least two zones of the target. As shown, the line A illustrates a system utilizing surface emitting devices. In this regard, the line A shows a sharp decrease from 100 percent output seen to 0 percent output seen at a border or edge of a zone. Using edge emitting devices, the output B is expected. This is a much more gently sloping curve. This illustrates one advantage of the use of surface emitting devices whereby at least one direction of the output is collimated—so that the gently sloping curves or Gaussian drop-off, such as that shown at line B is not experienced. In this regard, the output of the arrays using surface emitting devices can be expected to be much more rectilinear in nature, whereas the radiation output of edge emitting devices tends to be more elliptical and Gaussian. In this way, the use of surface emitting devices allows for better zone control for the output. Further, it will be appreciated that smaller arrays in higher number can be used for more granulated zone control versus larger arrays whereby larger zones or less precise zones are desired.

Figure 4:
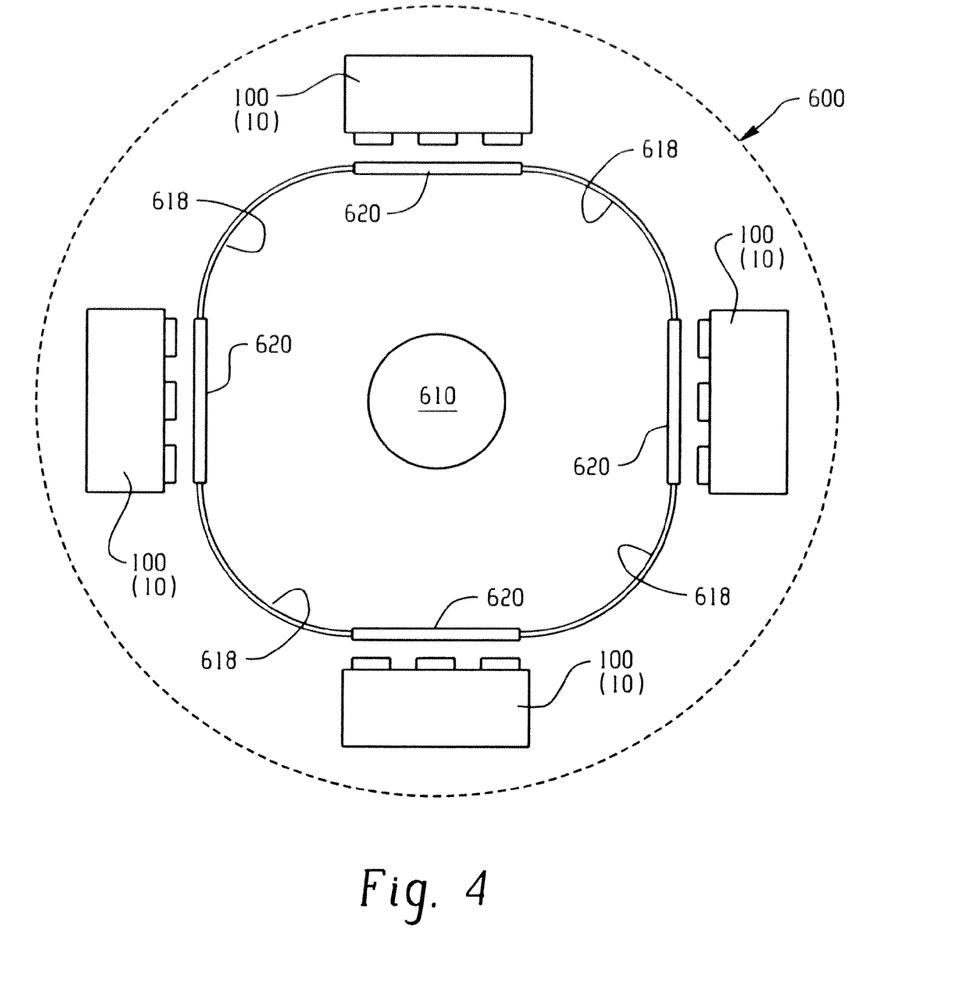
FIG. 4 is another system according to the presently described embodiments.

With reference to FIG. 4, the device 100 (or 10) may be incorporated in a cylindrical configuration to heat items such as a plastic bottle preform 610. In this form, the actual implementations may vary as a function of the designers desire to move the item 610, move the arrays 100, or both. Movement of either the source of irradiation or the target (through various means such as hydraulics, pistons, motors, etc.) may be necessary in a DHI heating application. A. Also, reflective surfaces 618 and lens arrangements 620 are illustrated. As above, these lens configurations can be greatly simplified and are more cost effective than other known lens arrangements for laser diode applications. The lens arrangement 620 can also provide the function of isolating the laser diode arrays from any contaminants which may come from the environment or the target. For example, food splatter in a cooking oven would be shielded from being deposited on any of the laser array apparatus so that it protects the life of same. If it is not necessary to use lensing in some types of applications, element 620 can take the form of only a protective shield which is transparent at the wavelength being used for the application. In some cases, both a lensing arrangement and a protective shield could be used. One reason for doing this might be so that the protective shield can be replaced periodically with a clean or unsoiled one. Such shields could either be disposable or of a type that they can be cleaned and reused.

Another feature that should be present with a protective shield could be anti-reflective coatings or coatings for other purposes. Some surface emitting laser diodes emit a polarized beam so the protective shield configuration may also have accommodations to use the polarization to good effect.

The arrangement shown in FIG. 4 further illustrates the advantage of the use of surface emitting devices as opposed to edge emitting devices in DHI applications. In this regard, it should be reiterated that the output of the surface emitting devices is perpendicular to the largest surface of the device or mounting arrangement or entity that is fabricated. In this regard, this allows for improved cooling and other techniques. So, in FIG. 4, very compact arrangements can be realized, which may be desired in some applications. If edge emitting devices were used in the arrangement shown in FIG. 4, the circuit boards may be required to be positioned so that multiple circuit boards are used to form each arrays and be arranged to protrude from the back side of the arrays. These circuit boards would be oriented in directions parallel to the output which is toward the target 610. As such, the configuration of the device 600 may be much larger and more complicated and cumbersome than is necessary with the use of surface emitting devices.

It should be appreciated that the operation of the presently described embodiments may vary as a function of the specific implementation. However, in at least one form, the systems described herein (and variations thereof) will generally provide for location or introduction of a target in an irradiation zone (e.g. by a conveyor, carousel, hydraulics, etc.) and subsequent operation of the surface emitting devices (in many forms configured in arrays) to emit narrowband radiation that matches a desired absorptive characteristic of the target toward the target. This allows for heating, cooking, etc. that is desired. The system will be under control of a controller or control module so that current is provided to the devices, or arrays of devices, in manners described herein, e.g. uniformly, in zones, at different wavelengths, at different locations, etc. It should be appreciated that the controller, as well as other devices of the contemplated system that control functionality, may take a variety of forms. For example, the controller may utilize memory devices or memory locations that store routines that are executed by suitable processors. In this regard, the techniques of the present invention may be implemented and/or controlled using a variety of different software routines and/or hardware configuration.

The above description merely provides a disclosure of particular embodiments of the invention and is not intended for the purposes of limiting the same thereto. As such, the invention is not limited to only the above-described embodiments. Rather, it is recognized that one skilled in the art could conceive alternative embodiments that fall within the scope of the invention.

We claim:

1. A system for non-contact injection of radiant energy into a target in an irradiation zone, the system comprising;
    an array of semi-conductor based narrowband radiation emitting device elements, the array being operative to emit radiation at a narrow wavelength band of radiant heat output which matches a desired absorptive characteristic of the target;
    the narrowband radiation emitting devices being mounted surface emitting laser diode devices;
    the array being mounted to a mounting entity comprising at least one of a circuit board and a cooling substrate such that the central axis of an irradiation pattern from the at least one narrowband radiation emitting devices is directed generally orthogonally relative to the largest plane of the mounting entity;

the mounting arrangement configured to position the array such that irradiation therefrom is directed to the target in the irradiation zone and such that relative geometrical locations of the surface emitting laser diode devices are determined with consideration of the irradiation output pattern of the combination of the devices to provide irradiation of the target; and a system operative to supply electrical current to the at least one narrowband radiation emitting device.

2. The system of claim 1 wherein the array comprises an X by Y matrix of surface emitting laser diode devices wherein both X and Y are greater than one (1).

3. The system of claim 1 wherein the array is in the form of an array of individual surface emitting laser diode devices arranged in series.

4. The system of claim 1 wherein one of a lensing or reflector arrangement is superimposed between the array and the target for the purpose of improving the irradiation pattern at the point where the irradiation reaches the intended target.

5. The system of claim 1 wherein devices are included in the array of at least two different device types:

the device types being defined by at least one of producing different wavelengths, being manufactured from different wafer substrate chemistry, of different physical sizes, different power outputs and of differing device output patterns.

6. The system of claim 5 wherein the array of at least two different device types is characterized by being three or more different device types.

7. The system of claim 5 wherein the different device types which are included in the array can produce at least two different wavelengths, the center of which wavelengths are within 100 nm from one another.

8. The system of claim 5 wherein the different device types which are included in the array can produce at least two different wavelengths, the center of which wavelengths are more than 150 nm from one another.

9. The system of claim 1 wherein the system operative to supply electrical current to the array is comprised of a system which can selectively supply current by way of:

at least one current controlling power supply which can be controlled by an intelligent controller, wherein the intelligent controller which controls the power supply comprises at least one of a programmable logic controller, a microprocessor-based control board, a computer control system, and an embedded logic controller.

10. The system of claim 9, wherein the intelligent controller has the ability to selectively control the irradiation from the at least two different device types.

11. The system of claim 9 wherein the intelligent controller is operative to digitally control the radiation from the at least one narrowband radiation emitting devices wherein the devices are configured to irradiate more than one irradiation zone on the target.

12. The system of claim 9 wherein the intelligent controller is operative to digitally control the radiation of the array wherein the devices are configured to irradiate at varying wavelengths corresponding to different absorption characteristics of the target.

13. The system of claim 1 whereby the geometrical arrangement of the surface emitting laser diode devices is arranged so that the irradiation output pattern does not require the superposition of any refracting, diffracting, or reflecting device between the laser diode devices and the irradiation target.

14. The system of claim 1 wherein the at least one of a circuit board and cooling substrate have more than eight surface emitting devices mounted thereon.

15. The system of claim 1 wherein the at least one narrowband radiation emitting device consists of an integrated circuit chip array of more than one surface emitting devices which were manufactured at the wafer level as a unit.

16. The system of claim 1 wherein the lasing inside each laser diode device occurs in a direction parallel to the mounting plane of the devices while the central axis of the output irradiation pattern is generally orthogonal thereto.

17. The system of claim 1 wherein the output irradiation pattern of at least some of devices is collimated photonic energy in at least one of its two fundamental 90° opposed axes.

18. The system of claim 1 wherein no component of the external irradiation pattern of each device is parallel to the largest plane of the laser diode device itself.

19. The system of claim 1 wherein no component of the external irradiation pattern of each device is parallel to the largest plane of the mounting substrate.

20. The system of claim 9 wherein the control includes the ability to control how much accumulated energy is irradiated to specific regions of the target.

21. The system of claim 1 wherein the central output wavelength of the devices is affected by less than 0.1 nanometer per degree centigrade of laser diode device operating temperature change.

22. A system for non-contact injection of radiant energy into a target, the system comprising:

at least one semi-conductor based narrowband radiation emitting device element, the at least one narrowband radiation emitting device being operative to emit radiation at a narrow wavelength band of radiant heat output which matches a desired absorptive characteristic of the target;

the at least one narrowband radiation emitting device being a mounted surface emitting laser diode device;

the at least one narrowband radiation emitting device being mounted to a mounting entity comprising at least one of a circuit board and a cooling substrate such that the central axis of an irradiation pattern from the at least one narrowband radiation emitting device is directed generally orthogonally relative to the largest plane of the mounting entity;

the mounting arrangement configured to position the at least one narrowband radiation emitting diode device such that irradiation therefrom is directed to a target in the irradiation zone; and a system operative to supply electrical current to the at least one narrowband radiation emitting device.

23. The system as set forth in claim 4 wherein the lensing arrangement comprises a single cylindrical lens.

24. The system as set forth in claim 1 wherein the surface emitting laser diode devices comprise surface emitting distributed feedback laser diode devices.

25. The system of claim 22 wherein the at least one semiconductor-based narrowband radiation emitting device element forms an array of more than one surface emitting laser diode devices.

26. The system of claim 25 wherein the array comprises an X by Y matrix of surface emitting laser diode devices wherein both X and Y are greater than one (1).

27. An irradiation array for the production of radiant energy associated with a target comprising:
- semi-conductor irradiation array wherein the devices are not mounted flush with any edges of a board upon which the array is mounted;
- wherein the mounting board is configured as a high heat conduction substrate which has at least one layer to conduct heat and one layer to conduct electrical supply current;
- wherein the array is comprised of surface emitting, semi-conductor laser devices;
- wherein the axis of the optical photonic output of the array of devices is substantially perpendicular to the large plane of the mounting substrate; and,
- wherein the mounting board is configured to thermally couple to at least one of a water jacket cooling system, a heat radiation fin arrangement, a state change cooler, a compressed media cooler and a thermo-electric cooler.

28. The system of claim 27 wherein the array is a X by Y array of individual surface emitting devices whereby both X and Y are greater than one.

29. The system of claim 27 wherein the array is an arrangement of surface-emitting devices whereby some of the devices are rotated relative to their neighboring devices.

30. A method for irradiating target items, the method comprising:
- introducing a target item into an irradiation zone;
- emitting radiation at a narrow wavelength band of radiant heat output which matches a desired absorption characteristic of the target item using an array of mounted surface emitting laser diode devices, wherein the array of mounted surface emitting laser diode devices is mounted to a mounting entity comprising at least one of a circuit board and a cooling substrate such that a central axis of an irradiation pattern from the device is directed generally orthogonally relative to the largest plane of the mounting entity; and
- irradiating the target item based on the irradiation device.

31. The method as set forth in claim 30 wherein the target item is a food item.

32. The method as set forth in claim 30 wherein the target item is a preform plastic bottle.

* * * * *